(12) United States Patent
Nakatani

(10) Patent No.: US 8,174,085 B2
(45) Date of Patent: May 8, 2012

(54) METHOD OF MANUFACTURING MEMS SENSOR AND MEMS SENSOR

(75) Inventor: Goro Nakatani, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 119 days.

(21) Appl. No.: 12/580,052

(22) Filed: Oct. 15, 2009

(65) Prior Publication Data

US 2010/0096714 A1 Apr. 22, 2010

(30) Foreign Application Priority Data

Oct. 16, 2008 (JP) ................................. 2008-267555

(51) Int. Cl.
*H01L 29/84* (2006.01)
(52) U.S. Cl. .. 257/417; 257/418; 257/419; 257/E27.114
(58) Field of Classification Search .................. 257/417, 257/418, 419, E27.114
See application file for complete search history.

(56) References Cited

U.S. PATENT DOCUMENTS

| | | | |
|---|---|---|---|
| 5,242,863 A | 9/1993 | Xiang-Zheng et al. | |
| 5,870,482 A | 2/1999 | Loeppert et al. | |
| 6,465,271 B1 | 10/2002 | Ko et al. | |
| 6,743,654 B2 | 6/2004 | Coffa et al. | |
| 6,930,367 B2 * | 8/2005 | Lutz et al. | 257/417 |
| 6,936,491 B2 * | 8/2005 | Partridge et al. | 438/48 |
| 7,023,066 B2 | 4/2006 | Lee et al. | |
| 7,074,637 B2 * | 7/2006 | Lutz et al. | 438/50 |
| 7,144,750 B2 | 12/2006 | Ouellet et al. | |
| 7,205,621 B2 * | 4/2007 | Sato et al. | 257/415 |
| 7,288,824 B2 * | 10/2007 | Partridge et al. | 257/414 |
| 7,329,933 B2 | 2/2008 | Zhe et al. | |
| 7,346,178 B2 | 3/2008 | Zhe et al. | |
| 7,381,663 B2 * | 6/2008 | Sato et al. | 438/48 |
| 7,781,249 B2 * | 8/2010 | Laming et al. | 438/51 |
| 7,803,665 B2 * | 9/2010 | Witvrouw et al. | 438/124 |
| 7,825,483 B2 * | 11/2010 | Nakatani et al. | 257/414 |
| 7,880,367 B2 * | 2/2011 | Nakatani | 310/331 |
| 7,919,006 B2 * | 4/2011 | Park et al. | 216/88 |
| 7,923,790 B1 * | 4/2011 | Quevy et al. | 257/415 |
| 7,972,887 B2 * | 7/2011 | Shimooka | 438/51 |
| 7,994,594 B2 * | 8/2011 | Inaba et al. | 257/416 |
| 8,003,422 B2 * | 8/2011 | Lee et al. | 438/53 |
| 2003/0042560 A1 * | 3/2003 | Crenshaw et al. | 257/415 |
| 2004/0147056 A1 * | 7/2004 | McKinnell et al. | 438/52 |
| 2005/0156260 A1 * | 7/2005 | Partridge et al. | 257/414 |
| 2005/0218488 A1 * | 10/2005 | Matsuo | 257/678 |

(Continued)

FOREIGN PATENT DOCUMENTS

JP 2001-518246 10/2001

(Continued)

*Primary Examiner* — Ngan Ngo
(74) *Attorney, Agent, or Firm* — Rabin & Berdo, P.C.

(57) ABSTRACT

A method of manufacturing an MEMS sensor according to the present invention includes the steps of: forming a first sacrificial layer on one surface of a substrate; forming a lower electrode on the first sacrificial layer; forming a second sacrificial layer made of a metallic material on the first sacrificial layer to cover the lower electrode; forming an upper electrode made of a metallic material on the second sacrificial layer; forming a protective film made of a nonmetallic material on the substrate to collectively cover the first sacrificial layer, the second sacrificial layer and the upper electrode; and removing at least the second sacrificial layer by forming a through-hole in the protective film and supplying an etchant to the inner side of the protective film through the through-hole.

4 Claims, 6 Drawing Sheets

U.S. PATENT DOCUMENTS

| | | | |
|---|---|---|---|
| 2005/0253283 A1* | 11/2005 | DCamp et al. | 257/787 |
| 2005/0260783 A1* | 11/2005 | Lutz et al. | 438/51 |
| 2006/0110854 A1* | 5/2006 | Horning et al. | 438/121 |
| 2006/0233401 A1 | 10/2006 | Wang | |
| 2006/0267109 A1* | 11/2006 | Ohguro | 257/396 |
| 2007/0004096 A1* | 1/2007 | Heuvelman | 438/127 |
| 2007/0064968 A1 | 3/2007 | Weigold | |
| 2007/0158826 A1 | 7/2007 | Sakakibara et al. | |
| 2007/0190680 A1 | 8/2007 | Fukuda et al. | |
| 2008/0135998 A1* | 6/2008 | Witvrouw et al. | 257/678 |
| 2008/0188025 A1* | 8/2008 | Nakamura | 438/51 |
| 2009/0045474 A1* | 2/2009 | Nakatani | 257/416 |
| 2009/0065928 A1* | 3/2009 | Lutz et al. | 257/704 |
| 2009/0111267 A1* | 4/2009 | Park et al. | 438/692 |
| 2009/0208037 A1 | 8/2009 | Zhe | |
| 2009/0294879 A1* | 12/2009 | Bhagavat et al. | 257/415 |
| 2010/0090298 A1* | 4/2010 | Shih et al. | 257/419 |
| 2010/0155864 A1* | 6/2010 | Laming et al. | 257/416 |
| 2010/0171153 A1* | 7/2010 | Yang | 257/254 |
| 2010/0210073 A1* | 8/2010 | Witvrouw et al. | 438/124 |
| 2010/0213557 A1* | 8/2010 | Wang | 257/417 |
| 2011/0012212 A1* | 1/2011 | Nakatani et al. | 257/416 |
| 2011/0031566 A1* | 2/2011 | Kim et al. | 257/419 |
| 2011/0062532 A1* | 3/2011 | Wang | 257/415 |
| 2011/0104845 A1* | 5/2011 | Nakatani | 438/50 |
| 2011/0108933 A1* | 5/2011 | Nakatani | 257/415 |
| 2011/0127624 A1* | 6/2011 | Nakatani | 257/416 |
| 2011/0140213 A1* | 6/2011 | Kasia et al. | 257/416 |
| 2011/0165718 A1* | 7/2011 | Lutz et al. | 438/51 |
| 2011/0169110 A1* | 7/2011 | Shih et al. | 257/419 |
| 2011/0183455 A1* | 7/2011 | Wang | 438/51 |
| 2011/0186945 A1* | 8/2011 | Shih et al. | 257/419 |
| 2011/0221013 A1* | 9/2011 | Partridge et al. | 257/414 |
| 2011/0227176 A1* | 9/2011 | Wang | 257/415 |

FOREIGN PATENT DOCUMENTS

JP 2007-180201 7/2007

* cited by examiner

METHOD OF MANUFACTURING MEMS SENSOR AND MEMS SENSOR

BACKGROUND OF THE INVENTION

1. Field of the Invention

The present invention relates to a sensor (an MEMS sensor) manufactured by an MEMS (Micro Electro Mechanical Systems) technique and a method of manufacturing the same.

2. Description of Related Art

An MEMS sensor, having been recently loaded on a portable telephone or the like, is increasingly watched with interest. For example, a silicon microphone (an Si microphone) is a typical example of the MEMS sensor.

The silicon microphone includes a silicon substrate. A through-hole is formed on a central portion of the silicon substrate, to penetrate the silicon substrate in the thickness direction. On the silicon substrate, a diaphragm made of polysilicon is arranged on a position opposed to the through-hole. The diaphragm is provided in a state floating up from the silicon substrate (at a small interval from the surface of the silicon substrate), to be vibratile in a direction opposed to the surface of the silicon substrate. A back plate made of polysilicon is arranged on a side of the diaphragm opposite to the silicon substrate. The back plate is opposed to the diaphragm at a small interval. The surface of the back plate is covered with a protective film made of SiN (silicon nitride).

The diaphragm and the back plate constitute a capacitor having the diaphragm and the back plate as counter electrodes. When the diaphragm vibrates by a sound pressure (a sound wave) while a prescribed voltage is applied to the capacitor, the capacitance of the capacitor changes, and voltage fluctuation between the diaphragm and the back plate resulting from the change of the capacitance is output as a sound signal.

In the steps of manufacturing the silicon microphone, a lower sacrificial layer is formed on the silicon substrate, and the diaphragm is formed on the lower sacrificial layer. Thereafter an upper sacrificial layer is formed to cover the overall region of the surface of the diaphragm, and the back plate is formed on the upper sacrificial layer. After the formation of the back plate, the protective film is formed to cover the overall regions of the surfaces of the upper sacrificial layer and the back plate. A through-hole is formed in the protective film, and an etchant is thereafter supplied to the inner side of the protective film through the through-hole, to remove the lower sacrificial layer and the upper sacrificial layer. Thus, the diaphragm floats up from the silicon substrate, while a space of a small interval is formed between the diaphragm and the back plate.

In consideration of the etching selection ratio between the lower and upper sacrificial layers and the protective film etc., $SiO_2$ (silicon oxide) is employed as the material for the lower and upper sacrificial layers and HF (hydrofluoric acid) is employed as the etchant in general. However, a relatively long time (20 to 30 minutes, for example) is required for removing the lower and upper sacrificial layers while the protective film is also exposed to the hydrofluoric acid over the long time, and hence the protective film is disadvantageously etched.

SUMMARY OF THE INVENTION

An object of the present invention is to provide a method of manufacturing an MEMS sensor and an MEMS sensor, capable of preventing undesired etching of a protective film made of a nonmetallic material.

A method of manufacturing an MEMS sensor according to an aspect of the present invention includes the steps of: forming a first sacrificial layer on one surface of a substrate; forming a lower electrode on the first sacrificial layer; forming a second sacrificial layer made of a metallic material on the first sacrificial layer to cover the lower electrode; forming an upper electrode made of a metallic material on the second sacrificial layer; forming a protective film made of a nonmetallic material on the substrate to collectively cover the first sacrificial layer, the second sacrificial layer and the upper electrode; and removing at least the second sacrificial layer by forming a through-hole in the protective film and supplying an etchant to the inner side of the protective film through the through-hole.

According to the method, the first sacrificial layer, the lower electrode, the second sacrificial layer, the upper electrode and the protective film made of the nonmetallic material are formed in this order on one surface of the substrate. Thus, the lower electrode is covered with the second sacrificial layer, and the first sacrificial layer, the second sacrificial layer and the upper electrode are collectively covered with the protective film. Thereafter the through-hole is formed in the protective film. Then, the etchant is supplied to the inner side of the protective film through the through-hole, to remove at least the second sacrificial layer.

The first sacrificial layer is preferably removed simultaneously with the second sacrificial layer or before or after the removal of the second sacrificial layer. Due to the removal of the first sacrificial layer, the lower electrode floats up from the substrate (in a state opposed to the substrate at an interval). Due to the removal of the second sacrificial layer, further, a space is formed between the lower electrode and the upper electrode, and the lower electrode and the upper electrode are opposed to each other at an interval. Consequently, the MEMS sensor having such a structure that the lower electrode and the upper electrode are arranged on one surface of the substrate to be opposed to each other at an interval and a surface of the upper electrode opposite to the side of the lower electrode is covered with the protective film is obtained.

The nonmetallic material is employed for the protective film, and the metallic material is employed for the second sacrificial layer. Therefore, the etching selection ratio of the protective film to the second sacrificial layer can be easily increased. When the second sacrificial layer is made of a metallic material containing Al (aluminum) and the protective film is made of an organic material, for example, the etching selection ratio of the protective film to the second sacrificial layer can be increased by employing chlorine-based gas as the etchant for etching the second sacrificial layer. Consequently, etching of the protective film can be prevented even if the protective film is exposed to the chlorine-based gas over a long period when the second sacrificial layer is etched.

When the first sacrificial layer is made of the same material as the material for the second sacrificial layer, the first and second sacrificial layers can be simultaneously removed by employing the same etchant. When the first sacrificial layer is made of a material different from that for the second sacrificial layer, on the other hand, the first sacrificial layer is removed by supplying an etchant capable of removing the first sacrificial layer to the inner side of the protective film before or after the removal of the second sacrificial layer.

Preferably, the second sacrificial layer is formed by sputtering, and the upper electrode is formed by sputtering continuously to the formation of the second sacrificial layer. Both of the second sacrificial layer and the upper electrode are made of the metallic materials, and hence the second sacrificial layer and the upper electrode can be continuously formed by sputtering. Thus, the steps of manufacturing the MEMS sensor can be simplified.

Preferably, the second sacrificial layer is made of a metallic material into which Si (silicon) is mixed. In this case, only a metallic component is removed from the metallic material when the second sacrificial layer is etched, and Si remains on the lower electrode as grains. The grains of Si remaining on the lower electrode function as stoppers preventing contact between the upper electrode and the lower electrode. Therefore, no additional step is required for forming a stopper for preventing contact between the upper electrode and the lower electrode. Thus, the steps of manufacturing the MEMS sensor can be further simplified.

The material for the upper electrode may be TiN (titanium nitride), TiW (titanium tungsten), Cr (chromium) or W (tungsten). In this case, the MEMS sensor manufactured by the method according to the present invention includes: a substrate; a lower electrode opposed to one surface of the substrate at an interval; an upper electrode opposed to a side of the lower electrode opposite to the substrate at an interval; and a protective film covering a surface of the upper electrode opposite to the side of the lower electrode, and the upper electrode is made of TiN, TiW, Cr or W.

The upper electrode is made of TiN, TiW, Cr or W, whereby a metallic material containing Al can be employed as the material for the second sacrificial layer formed for manufacturing the MEMS sensor. TiN, TiW, Cr or W is a relatively hard metallic material. When the metallic material is employed for the upper electrode, therefore, high strength can be ensured for the upper electrode.

The protective film may be made of an organic material.

The lower electrode may be a diaphragm in the form of a thin circular film, and the upper electrode may be a back plate having a circular outer shape in plan view smaller in diameter than the diaphragm.

The material for the lower electrode may be doped polysilicon.

A lower stopper for preventing adhesion between the substrate and the lower electrode may be formed on a surface of the lower electrode opposed to the substrate.

The foregoing and other objects, features and effects of the present invention will become more apparent from the following detailed description of the embodiments with reference to the attached drawings.

DETAILED DESCRIPTION OF PREFERRED EMBODIMENTS

Figure 1:
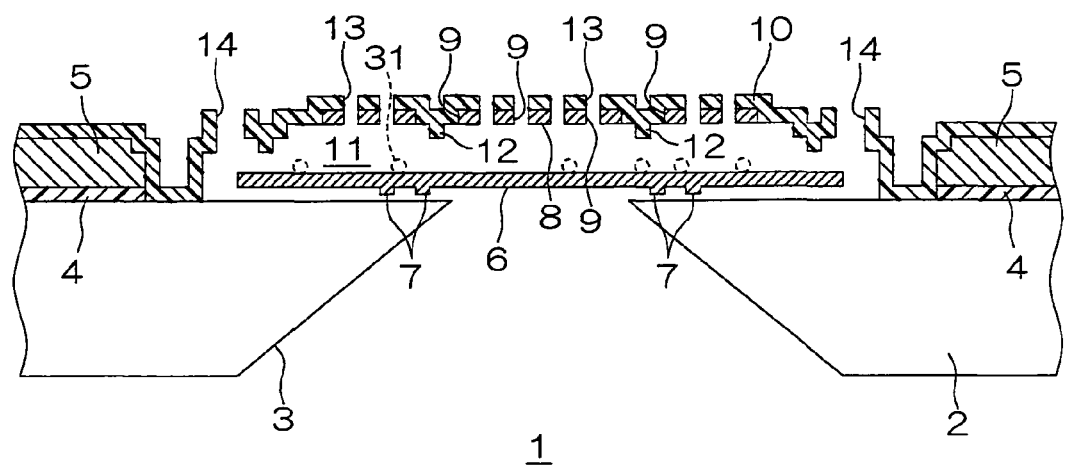
FIG. 1 is a schematic sectional view of a silicon microphone according to an embodiment of the present invention.
Figure 2:
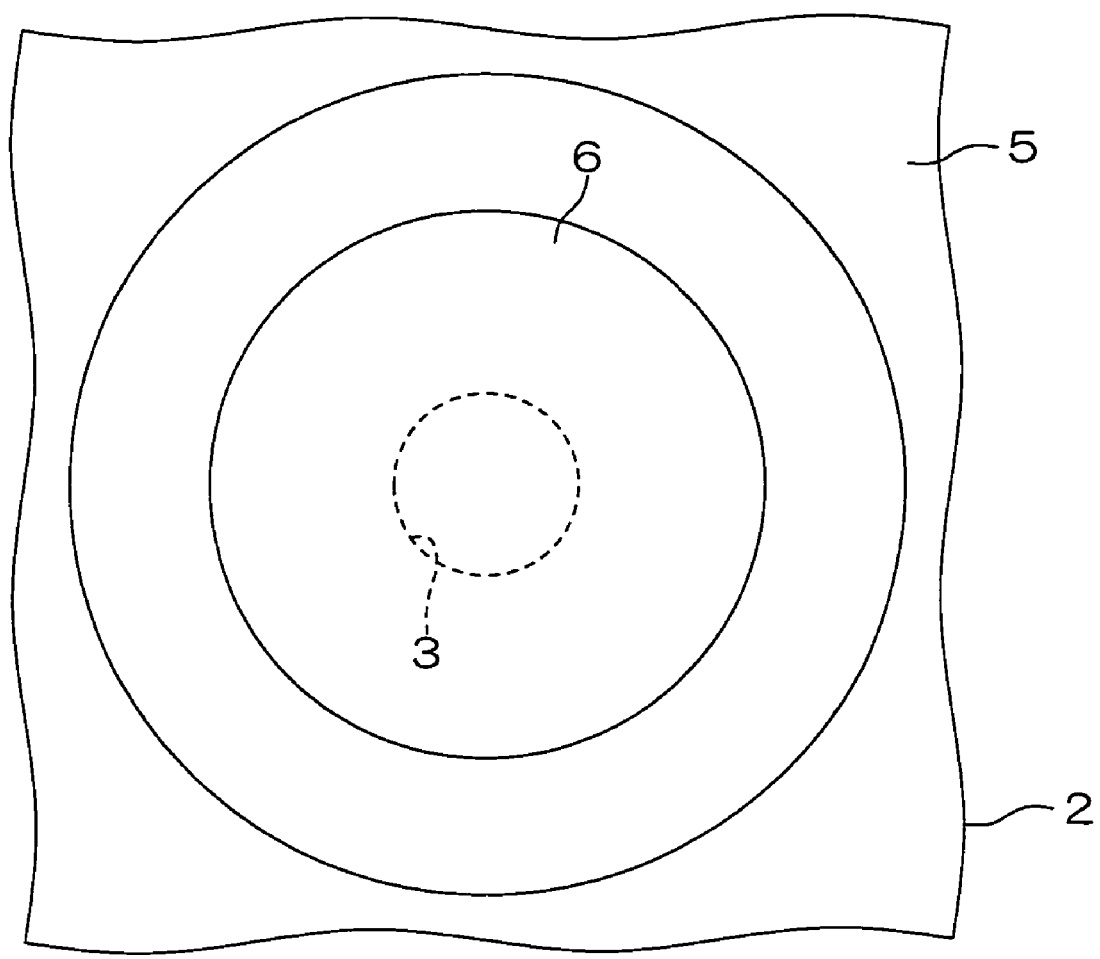
FIG. 2 is a schematic plan view of the silicon microphone shown in FIG. 1, where a back plate and a protective film are omitted.

FIG. 1 is a schematic sectional view of a silicon microphone according to an embodiment of the present invention. FIG. 2 is a schematic plan view of the silicon microphone shown in FIG. 1.

A silicon microphone 1 is a sensor (an MEMS sensor) manufactured by the MEMS technique. The silicon microphone 1 includes a substrate 2 made of silicon. A through-hole 3 having a trapezoidal sectional shape narrowed toward the surface (the upper surface) (spreading toward the rear surface) is formed on a central portion of the substrate 2.

An insulating film 4 and a metal film 5 are stacked on the substrate 2 in this order from the side closer to the substrate 2. The insulating film 4 is made of $SiO_2$, for example. The metal film 5 is made of Al, for example. The insulating film 4 and the metal film 5 are partially removed from a region including the through-hole 3 in plan view, and the surface of the substrate 2 is exposed in the region.

A diaphragm 6 in the form of a thin circular film is provided above the exposed portion of the surface of the substrate 2 at a small interval from the surface of the substrate 2. In other words, the diaphragm 6 is opposed to the through-hole 3, and arranged in a state floating up from a portion of the surface of the substrate 2 around the through-hole 3. A plurality of lower stoppers 7 for preventing adhesion between the diaphragm 6 and the substrate 2 are formed on the lower surface (the surface opposed to the substrate 2) of the diaphragm 6. Further, a supporting portion (not shown) is integrally formed on the diaphragm 6. The supporting portion is held between the insulating film 4 and the metal film 5, and the diaphragm 6 is supported by the supporting portion to be vibratile in a direction opposed to the substrate 2. The diaphragm 6 and the supporting portion are made of polysilicon (doped polysilicon) doped with an impurity to be supplied with conductivity, for example.

A back plate 8 is provided above the diaphragm 6. The back plate 8 has a circular outer shape in plan view smaller in diameter than the diaphragm 6, and is opposed to the diaphragm 6 at an interval. A plurality of holes 9 are formed in the back plate 8. The back plate 8 is made of TiN, for example.

The outermost surface of the silicon microphone 1 is covered with a protective film 10. More specifically, the protective film 10 continuously covers the surfaces of the insulating film 4, the metal film 5 and the substrate 2, is uprighted from the surface of the substrate 2 to surround the diaphragm 6 at an interval from the diaphragm 6, and covers the upper surface (the surface opposite to the side of the diaphragm 6) of the back plate 8. Thus, a space 11 partitioned by the protective film 10 is formed on the substrate 2, and the diaphragm 6 is arranged in the space 11 in a state not in contact with the substrate 2, the back plate 8 and the protective film 10. In FIG. 2, the back plate 8 and the protective film 10 are omitted.

The protective film 10 enters partial holes 9 of the back plate 8. Portions 12 of the protective film 10 entering the holes 9 protrude from the holes 9 downward beyond the lower surface (the surface opposed to the diaphragm 6) of the back plate 8, and function as upper stoppers for preventing contact between the diaphragm 6 and the back plate 8.

In the protective film 10, holes 13 are formed on positions opposed to the holes 9 not receiving the protective film 10, to communicate with the holes 9. In the protective film 10, further, a plurality of holes 14 are formed around the back plate 8. Thus, the space 11 inside the protective film 10 communicates with an outer portion on the side of the rear surface of the substrate 2 through the through-hole 3, and communicates with an outer portion on the side of the surface of the substrate 2 through the holes 9, 13 and 14.

The protective film 10 is made of polyimide, for example.

The diaphragm 6 and the back plate 8 constitute a capacitor having the diaphragm 6 and the back plate 8 as counter electrodes. A prescribed voltage is applied to the capacitor (between the diaphragm 6 and the back plate 8). When the diaphragm 6 vibrates by a sound pressure (a sound wave) in this state, the capacitance of the capacitor changes, and voltage fluctuation between the diaphragm 6 and the back plate 8 resulting from the change of the capacitance is extracted (output) as a sound signal.

FIGS. 3A to 3H are schematic sectional views for illustrating a method of manufacturing the silicon microphone 1 shown in FIG. 1.

Figure 3A:
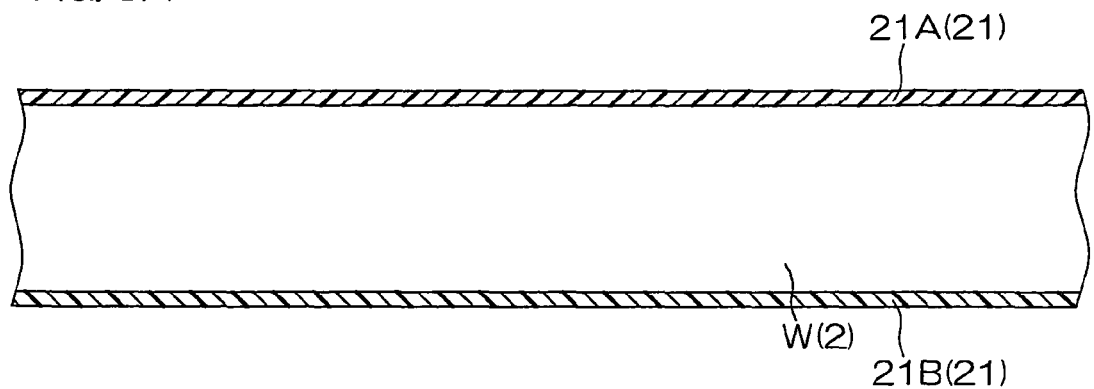
FIGS. 3A to 3H are schematic sectional views for illustrating a method of manufacturing the silicon microphone shown in FIG. 1.

First, oxide films 21 made of $SiO_2$ are formed on the overall surfaces of a silicon wafer W serving as the matrix of the substrate 2 by thermal oxidation, as shown in FIG. 3A. In the following description, the oxide film 21 formed on the surface of the silicon wafer W is referred to as a surface oxide film 21A and the oxide film 21 formed on the rear surface of the silicon wafer W is referred to as a rear surface oxide film 21B, to be distinguished from each other.

Figure 3B:
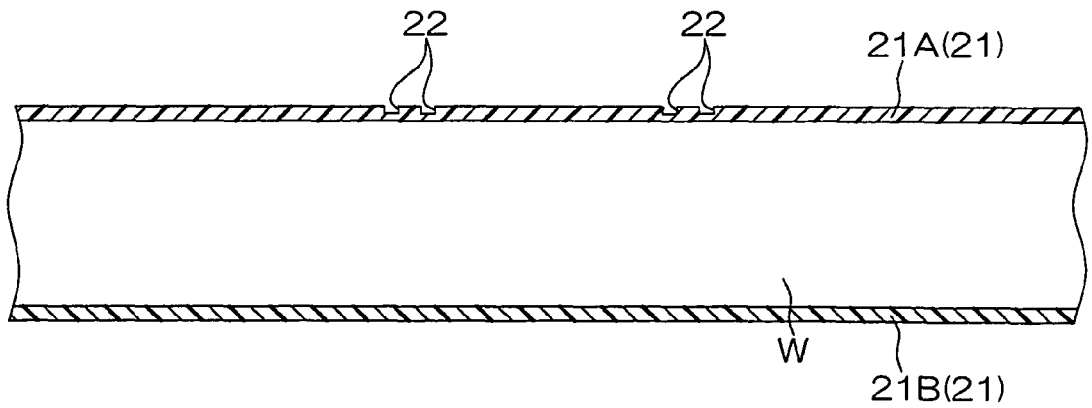

Then, a plurality of recesses 22 are formed in the surface oxide film 21A by photolithography and etching, as shown in FIG. 3B. More specifically, a resist pattern having openings selectively exposing portions for forming the recesses 22 is formed on the surface oxide film 21A. Portions (portions facing the openings) of the surface oxide film 21A exposed from the resist pattern are dug up to a depth not penetrating the surface oxide film 21A, whereby the plurality of recesses 22 are formed in the surface oxide film 21A. The resist pattern is removed after the formation of the recesses 22.

Figure 3C:
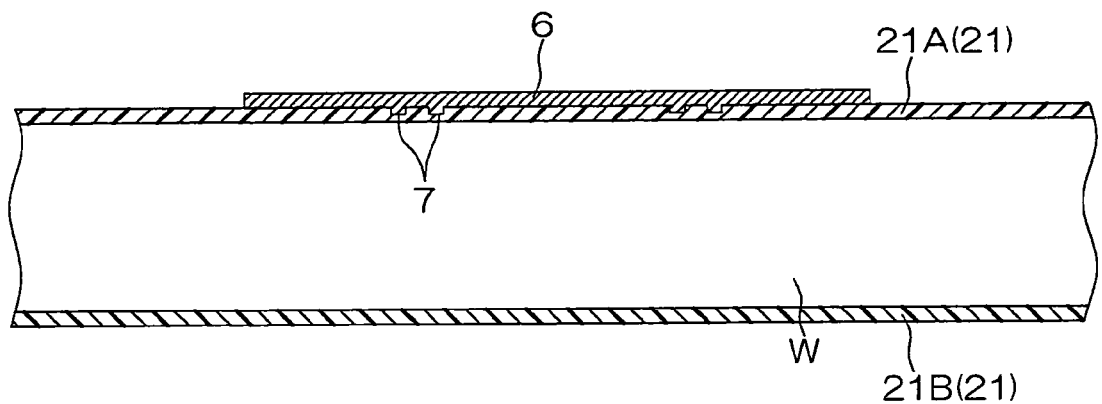

Thereafter doped polysilicon is deposited on the surface oxide film 21A by LPCVD (Low Pressure Chemical Vapor Deposition). Then, the deposition layer of the doped polysilicon is selectively removed from the surface oxide film 21A by photolithography and etching. Thus, the diaphragm 6 is formed on the surface oxide film 21A, as shown in FIG. 3C.

Figure 3D:
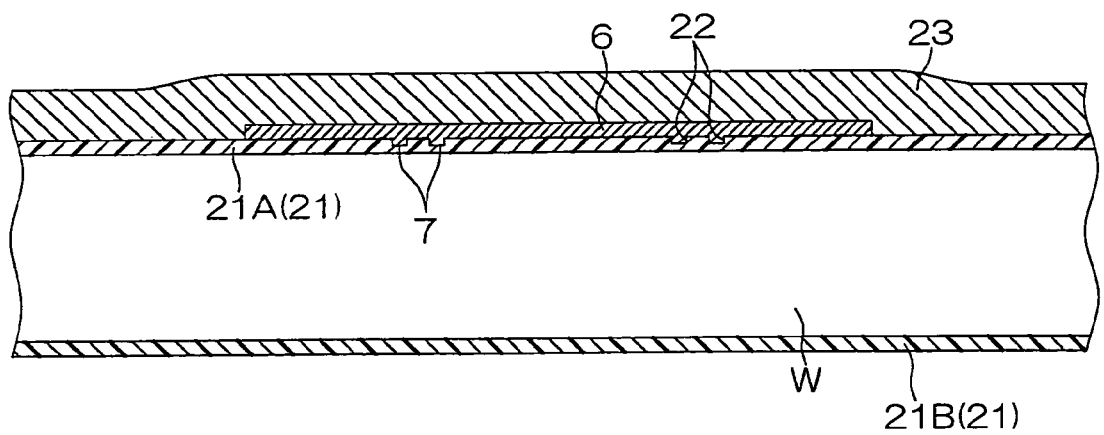

Then, an Al film 23 is formed on the overall region of the surface oxide film 21A by sputtering, as shown in FIG. 3D.

Figure 3E:
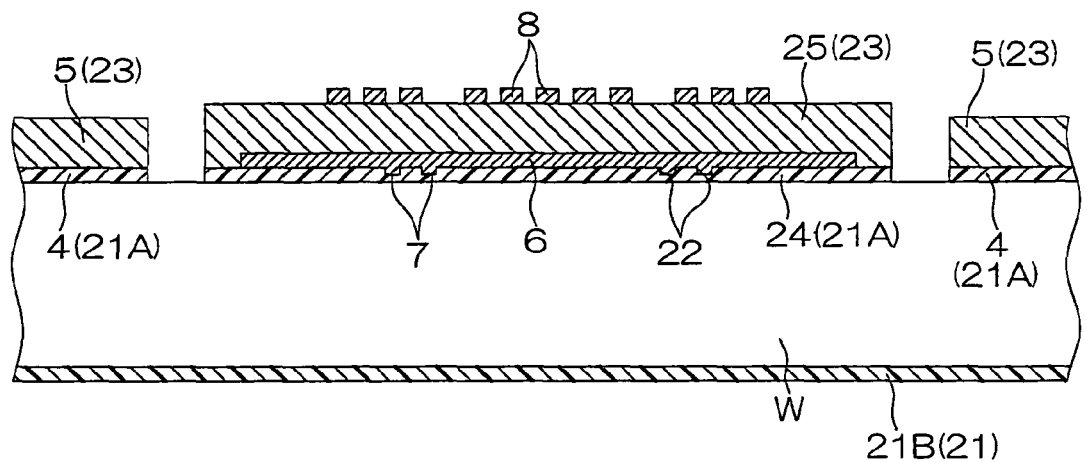

Following the formation of the Al film 23, a TiN film is formed on the Al film 23 by sputtering, as shown in FIG. 3E. Then, the TiN film is patterned into the back plate 8 by photolithography and etching. Thereafter the surface oxide film 21A and the Al film 23 are selectively removed by photolithography and etching. Thus, the surface oxide film 21A is divided into the insulating film 4 and a first sacrificial layer 24, while the Al film 23 is divided into the metal film 5 and a second sacrificial layer 25. The diaphragm 6 is covered with the second sacrificial layer 25.

Figure 3F:
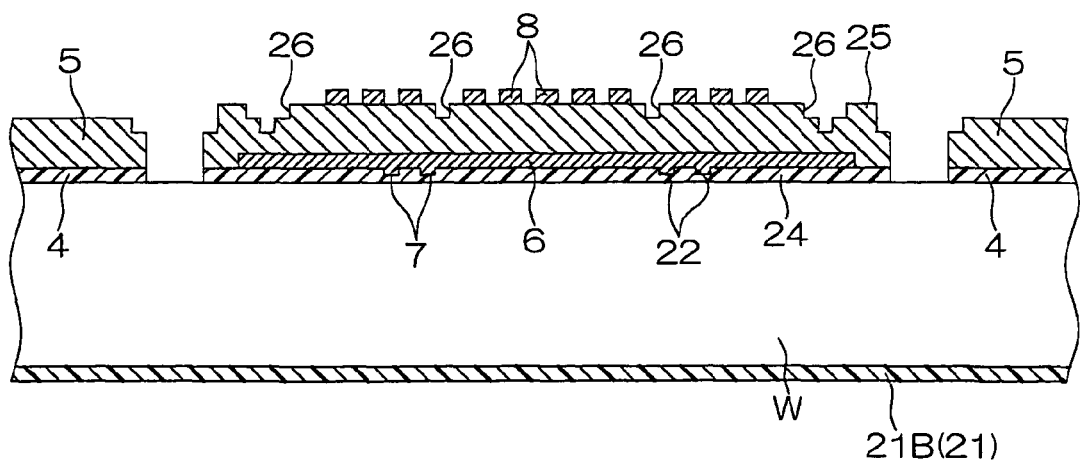

Thereafter a plurality of recesses 26 are formed in the second sacrificial layer 25 by photolithography and etching, as shown in FIG. 3F.

Figure 3G:
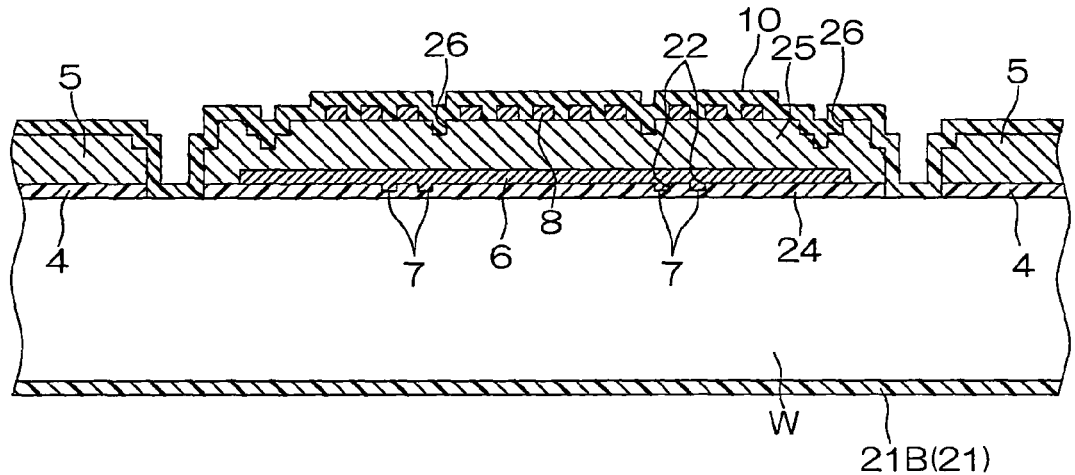

Then, the protective film 10 is formed by applying a polyimide solution to collectively cover the insulating film 4, the metal film 5, the first sacrificial layer 24 and the second sacrificial layer 25 and hardening the same, as shown in FIG. 3G.

Figure 3H:
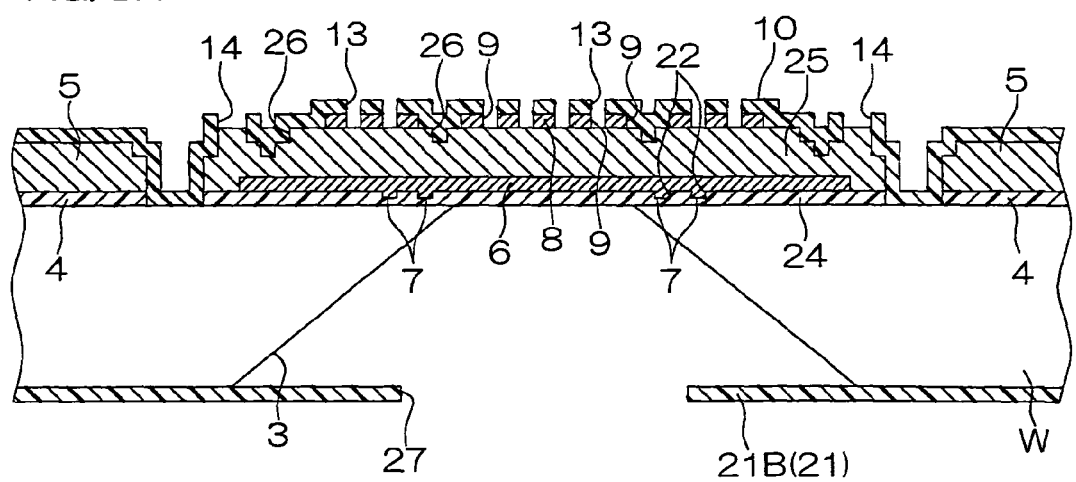

Then, the holes 13 and 14 are formed in the protective film 10 by photolithography and etching, while the protective film 10 is partially removed from the holes 9 of the back plate 8, as shown in FIG. 3H. Further, an opening 27 is formed in the rear surface oxide film 21B by photolithography and etching, and the through-hole 3 is formed in the silicon wafer W by etching the silicon wafer W through the opening 27.

Thereafter the first sacrificial layer 24 and the second sacrificial layer 25 are removed by etching. More specifically, the first sacrificial layer 24 is removed by employing HF (hydrofluoric acid) as an etchant for wet etching and supplying the same to the inner side of the protective film 10 through the through-hole 3. Before or after the removal of the first sacrificial layer 24, further, the second sacrificial layer 25 is removed by employing chlorine-based gas ($BCl_3$ (boron trichloride), for example) as an etchant for dry etching and supplying the same to the inner side of the protective film 10 through the holes 9, 13 and 14. Due to the removal of the first and second sacrificial layers 24 and 25, the diaphragm 6 floats up from the silicon wafer W. Further, a space is formed between the diaphragm 6 and the back plate 8. Then, the rear surface oxide film 21B is removed, an the silicon wafer W is cut into the substrate 2, whereby the silicon microphone 1 shown in FIG. 1 is obtained.

As hereinabove described, polyimide is employed as the material for the protective film 10, and Al is employed as the material for the second sacrificial layer 25. Thus, an etching selection ratio of the protective film 10 to the second sacrificial layer 25 can be largely ensured by employing the chlorine-based gas as the etchant for removing the second sacrificial layer 25. Even if the protective film 10 is exposed to the chlorine-based gas over a long period when the second sacrificial layer 25 is etched, therefore, etching of the protective film 10 can be prevented.

The back plate 8 is formed by sputtering, continuously to the formation of the Al film 23 serving as the matrix of the second sacrificial layer 25. Both of the back plate 8 and the second sacrificial layer 25 are made of the metallic materials, whereby the same can be continuously formed by sputtering. Thus, the steps of manufacturing the silicon microphone 1 can be simplified.

While Al is employed as the material for the second sacrificial layer 25 in this embodiment, a metallic material such as Ti (titanium), Au (gold), Cu (copper) or Co (cobalt), for example, other than Al may alternatively be employed as the material for the second sacrificial layer 25. Further alternatively, an alloy material of Al and Cu or the like may be employed as the material for the second sacrificial layer 25.

A material (a material prepared by mixing Si into Al in a mixing ratio of 1%, for example) prepared by mixing Si into a metallic material may be employed as the material for the second sacrificial layer 25. In this case, only a metallic component is removed from the metallic material when the second sacrificial layer 25 is etched, and Si remains on the diaphragm 6 as grains 31, as shown by broken lines in FIG. 1. The grains 31 of Si remaining on the diaphragm 6 function as stoppers preventing contact between the diaphragm 6 and the back plate 8. Therefore, the upper stopper 12 can be omitted, and the step (the step shown in FIG. 3F) of forming the recesses 26 for forming the upper stopper 12 can be omitted. Consequently, the steps of manufacturing the silicon microphone 1 can be simplified.

In place of the surface oxide film 21A serving as the matrix of the first sacrificial layer 24, a thin film made of a metallic material such as Al may be formed on the surface of the silicon wafer W by sputtering, for example.

The first sacrificial layer 24 and the second sacrificial layer 25 may be made of the same material. In this case, the first sacrificial layer 24 and the second sacrificial layer 25 can be simultaneously removed by supplying the etchant to the inner side of the protective film 10 through the through-hole 3 and the holes 9, 13 and 14.

The material for the back plate 8 is not restricted to TiN, but may simply be a material having etching selectivity with respect to the first sacrificial layer 24 and the second sacrificial layer 25 and conductivity. TiW, Cr or W can be illustrated as such a material, for example.

The material for the protective film 10 may simply be a nonmetallic material, such as an organic material such as polyamide or polyparaxylene other than polyimide, or an inorganic material such as SiN.

While the silicon microphone 1 is employed as an example of the MEMS sensor, the present invention is not restricted to this, but is also applicable to a pressure sensor or an acceleration sensor operating by detecting the quantity of change of a capacitance.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2008-267555 filed with the Japan Patent Office on Oct. 16, 2008, the disclosure of which is incorporated herein by reference.

What is claimed is:

1. An MEMS sensor, comprising:
a substrate;
a lower electrode opposed to one surface of the substrate at an interval;
an upper electrode opposed at an interval to a side of the lower electrode opposite of the substrate; and
a protective film covering a surface of the upper electrode opposite of the side of the lower electrode;
the upper electrode being made of TiN, TiW, Cr or W;
the lower electrode including an outer periphery portion led out from the upper electrode and a central portion encompassed by the outer periphery portion; and
a lower stopper configured to prevent adhesion between the substrate and the lower electrode being formed on a surface of the lower electrode opposed to the substrate in the central portion.

2. The MEMS sensor according to claim 1, wherein the protective film is made of an organic material.

3. The MEMS sensor according to claim 1, wherein
the lower electrode is a diaphragm in the form of a thin circular film, and
the upper electrode is a back plate having a circular outer shape in plan view smaller in diameter than the diaphragm.

4. The MEMS sensor according to claim 1, wherein the lower electrode is made of doped polysilicon.

* * * * *